United States Patent [19]

Suda et al.

[11] Patent Number: 4,729,969
[45] Date of Patent: Mar. 8, 1988

[54] METHOD FOR FORMING SILICIDE ELECTRODE IN SEMICONDUCTOR DEVICE

[75] Inventors: Kakutaro Suda; Tadashi Hirao, both of Itami, Japan

[73] Assignee: Mitsubishi Denki Kabushiki Kaisha, Tokyo, Japan

[21] Appl. No.: 903,900

[22] Filed: Sep. 4, 1986

[30] Foreign Application Priority Data

Sep. 5, 1985 [JP] Japan .................... 60-198217

[51] Int. Cl.[4] .................................. H01L 21/283
[52] U.S. Cl. .............................. 437/200; 437/203; 437/24; 357/67
[58] Field of Search ............... 29/591, 590, 576 B; 148/1.5; 357/67, 71; 437/200, 203, 24

[56] References Cited

U.S. PATENT DOCUMENTS 4,339,869  7/1982  Reihl et al. ............... 29/576 B
4,551,908 11/1985  Nagasawa et al. ........... 29/571
4,558,509 12/1985  Okabayashi et al. ......... 29/571

FOREIGN PATENT DOCUMENTS 1157581  7/1969  United Kingdom .
1250099 10/1971  United Kingdom .
2140619 11/1984  United Kingdom .
2151847  7/1985  United Kingdom .
2157079 10/1985  United Kingdom .

OTHER PUBLICATIONS

Rausch et al., "Palladium Silicide Contact . . . ", in *IBM TDB*, vol. 24, No. 7A, Dec. 1981.
*Silicides for VLSI Applications*, S. P. Murarka, 1983, Academic Press, pp. 66–69.
*Extended Abstracts of the 17th Conference on Solid State Devices and Materials*, "A 2.1-GHz 56-mW Two-Modulus Prescaler IC Using Salicide Base Contact Technology", T. Hirao et al., Tokyo, 1985, pp. 381-384.
S. P. Murarka, "Refractory Silicides for Integrated Circuits", *Journal of Vacuum Science Technology*, 17(4), Jul./Aug. 1980, pp. 775-792.

*Primary Examiner*—Brian E. Hearn
*Assistant Examiner*—T. N. Quach
*Attorney, Agent, or Firm*—Lowe, Price, LeBlanc, Becker & Shur

[57] ABSTRACT

According to the present invention, a method for forming a metal silicide electrode in contact with a doped region of a silicon substrate through a contact hole which is opened through an insulator film over said substrate, comprises the steps of: covering not only the contact hole area but also the insulator film with a metal film; injecting silicon ions into a predetermined area of the metal film covering the insulator portion adjacent the contact hole area; forming a continuous metal silicide film by annealing only on both the hole area and the ion-injected area; removing the metal film to leave the metal silicide film as an electrode which extends laterally to cover the hole area and the adjacent insulator portion. According to another aspect of the present invention, silicon ions are implanted into the area of the indulating film adjacent the contact hole area prior to a conformal deposition of metal. An annealing hep is carried out to form silicide. Unreacted metal is then removed to leave a metal silicide electrode extending laterally to cover both the hole area and the adjacent area of the insulator film.

2 Claims, 16 Drawing Figures

METHOD FOR FORMING SILICIDE ELECTRODE IN SEMICONDUCTOR DEVICE

BACKGROUND OF THE INVENTION

1. Field of the Invention

This invention relates to a method for fabricating a semiconductor device and more particularly to a method for forming an electrode structure in an IC device.

2. Description of the Prior Art

Silicides for IC applications are described by T. Hirao et al. in Extended Abstracts of the 17th Conference on Solid State Devices and Materials, Tokyo, 1985, pp. 381–384 and also by S. P. Murarka in SILICIDES FOR VLSI APPLICATIONS, pp. 66–69, 1983, Academic Press.

FIGS. 1A to 1E are enlarged fragmentary sectional views illustrating the principal steps in a conventional method for forming a silicide electrode in a semiconductor device.

Referring to FIG. 1A, an oxide layer 2 is formed on, e.g., a p-type silicon substrate 1 and then coated with a passivation film 3 of phospho-silicate glass (PSG).

Referring to FIG. 1B, when an n+-type region 41 to be brought into contact with an electrode is formed at a part on the p-type silicon substrate 1, a contact hole 40 is opened through both the PSG film 3 and the oxide layer 2, followed by ion implantation of n-type impurity through the hole 40.

Referring to FIG. 1C, the surface of the above processed substance is then covered with a metal film 5 of Ti, Mo, W, Pt, Pd or the like. The metal film 5 is then silicidized in a self-aligned manner by annealing only in an area where it is in direct contact with the n+-type region 41 of the silicon substrate 1.

Referring to FIG. 1D, the remaining metal film regions which have not been silicidized are then removed by aqua regia. As a result, a metal silicide electrode 51 is formed on the n+-type region 41.

Finally referring to FIG. 1E, a lead wire 6 of a low resistive metal such as aluminum (Al) is formed over the silicide electrode 51. The silicide electrode prevents junction-spike (for example, preventing reaction between the Al wire and the silicon substrate).

However, when it is desired for high integration and high performance of a device that a plurality of electrode contact areas are formed close to one another on a semiconductor substrate, the conventional method illustrated in FIGS. 1A to 1E arouses the following problem.

FIG. 2 is a sectional view of an electrode structure formed by the conventional method. A first n+-type layer 41 and a second n+-type layer 42 are formed to be close to each other on a semiconductor substrate 1. A first Al wire 61 is formed over a first silicide electrode 51 which is in direct contact with the first n+-type layer 41, and similarly, a second Al wire 62 is formed over a second silicide electrode 52 which is in direct contact with the second n+-type layer 42. In this structure, the separation D between the contact holes must be larger than the separation A between the wires 61, 62 plus a total width of margins B and C of the respective wires 61, 62 extending beyond the respective contact holes, and such margins remain inevitably even if the distance A is reduced by improvement in accuracy of photoetching. Therefore, the minimum separation E between the neighboring n+-type regions 41, 42 is limited depending on the minimum separation A between the wires 61, 62. To resolve this problem, the following electrode structure may be considered.

FIG. 3 is a sectional view of another electrode structure similar to that of FIG. 2, except that a first n+-type region 41 is extended to approach a second n+-type region 42. Although the separation between the n+-type regions 41, 42 can be surely reduced independently on the minimum separation between the wires 61, 62 in this structure, at least one of the n+-type regions 41, 42 is necessarily formed large in area, so that the device characteristics will be deteriorated due to an increase in the junction capacitance.

SUMMARY OF THE INVENTION

In view of the prior art, it is a major purpose of the present invention to provide a method for forming an electrode structure in a IC with which a plurality of doped regions to be brought into contact with their respective silicide electrodes can be formed not only in a small area but also close to one another independently of the minimum separation between their respective lead wires.

According to an aspect of the present invention, a method for forming a metal silicide electrode in contact with a doped region of a silicon substrate through a contact hole which is opened through an insulator film over the substrate, comprises the steps of: covering not only the contact hole area but also the insulator film with a metal film; injecting silicon ions into a predetermined area of the metal film on the insulator film; forming a continuous metal siliside film by annealing only on both the hole area and the ion-injected area; and removing the metal film to leave the metal silicide film as an electrode.

According to another aspect of the present invention, a method for forming a metal silicide electrode in contact with a doped region of a silicon substrate through a contact hole which is opened through an insulator film over the substrate, comprises the steps of: injecting silicon ions into a predetermined area of the insulator film; covering not only the contact hole area but also the insulator film with a metal film; forming a continuous metal silicide film by annealing only on both the hole area and the ion-injected area; removing the metal film to leave the metal silicide film as an electrode.

These objects and other objects, features, aspects and advantages of the present invention will become more apparent from the following detailed description of the present invention when taken in conjunction with the accompanying drawings.

DESCRIPTION OF THE PREFERRED EMBODIMENTS

FIGS. 4A to 4E are fragmentary sectional views illustrating the principal steps in a method for forming a silicide electrode according to an embodiment of the present invention.

Figure 4A:
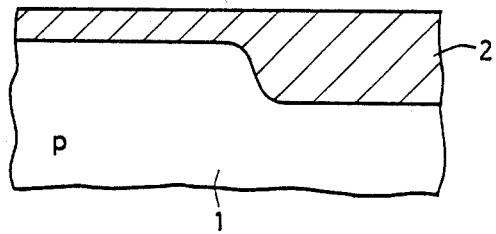
FIGS. 4A to 4F are fragmentary sectional views illustrating the principal steps in a method for forming a silicide electrode according to an embodiment of the present invention.

In FIG. 4A, an oxide layer 2 is formed on, e.g., a p-type silicon substrate 1.

Figure 4B:
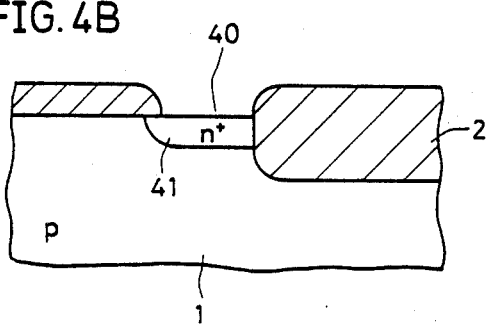

Referring to FIG. 4B, when an $n^+$-type region 41 to be brought into contact with an electrode is formed at a part on the p-type silicon substrate 1, a contact hole 40 is opened through the oxide layer 2 with a resist film mask (not shown), followed by ion implantation of n-type impurity through the hole 40.

Figure 4C:
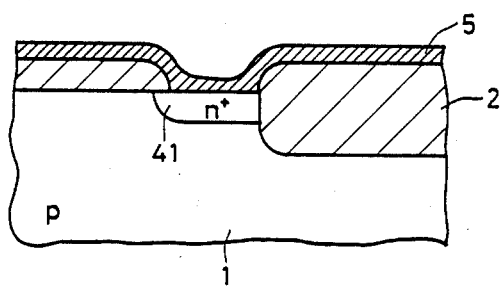

In FIG. 4C, the surface of the above processed substance is then covered with a metal film 5.

Figure 4D:
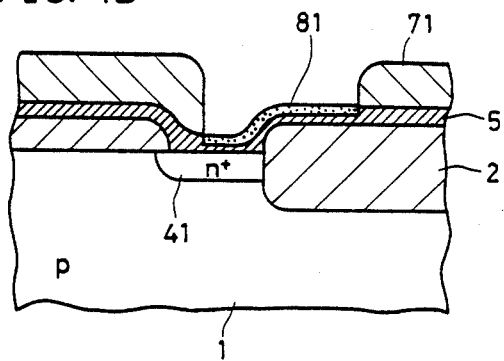

Referring to FIG. 4D, a resist film pattern 71 is formed in predetermined areas by etching, and then silicon ions 81 are injected into the metal film 5 utilizing the resist film 71 as a mask (silicon ions absorbed by the resist film 71 not being shown).

Figure 4E:
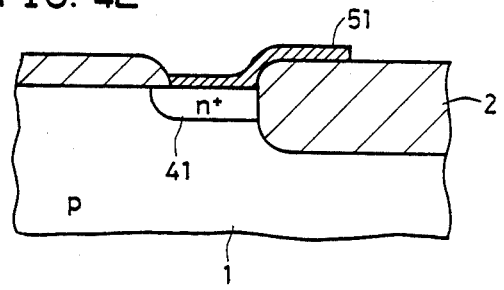

Referring to FIGS. 4D and 4E, after removal of the resist film 71, the metal film 5 is silicidized in a self-aligned manner by annealing only in an area where the metal film 5 contains the injected silicon or/and is in direct contact with the $n^+$-type region 41 of the silicon substrate 1. Then, the remaining metal film regions which have not been silicidized are removed to leave a continuous metal silicide electrode 51.

Figure 4F:
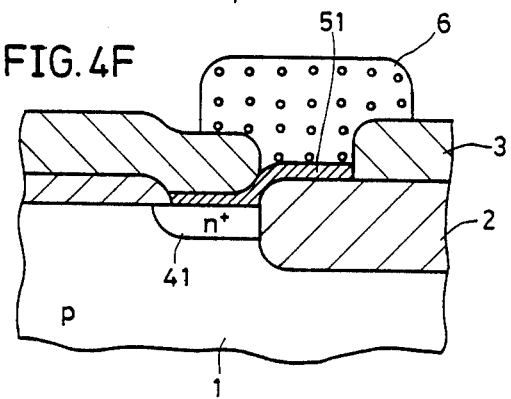

Referring to FIG. 4F, the surface of the substance is covered by a passivation film 3 of PSG and a hole is opened through the passivation film 3 at a predetermined area. Then, a lead wire 6 of a low resistive metal is formed and connected with the silicide electrode 51 through the hole.

Figure 5A:
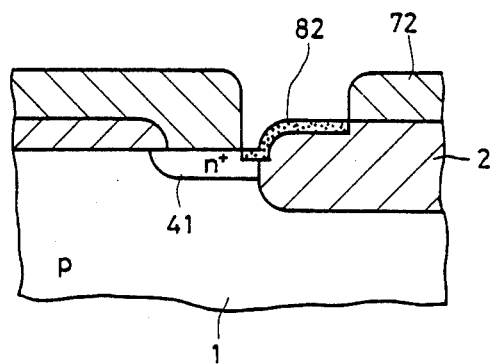
FIGS. 5A and 5B are sectional views showing steps which can replace those of FIGS. 4C and 4D.
Figure 5B:
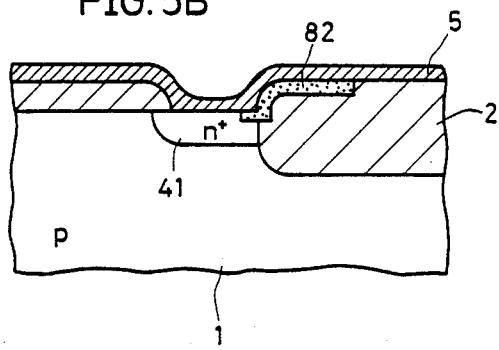

FIGS. 5A and 5B are sectional views showing steps which can replace those of FIGS. 4C and 4D.

Referring to FIGS. 4B and 5A, after formation of the $n^+$-type region 41, silicon ions are injected into a predetermined area 82 of the oxide layer 2, utilizing a resist film 72 as a mask formed with a predetermined pattern on both the $n^+$-type region 41 and the oxide layer 2.

Referring to FIGS. 5A and 5B, after removal of the resist film 72, the surface of the substance is covered with a metal film 5. The metal film 5 is then silicidized in a self-aligned manner by annealing only in an area where the metal film 5 is in direct contact with the silicon-injected oxide layer region 82 and the $n^+$-type regions. Thereafter, the remaining metal film region which have not been silicidized are removed to leave a continuous metal silicide electrode 51 as shown in FIG. 4E.

Figure 1A:
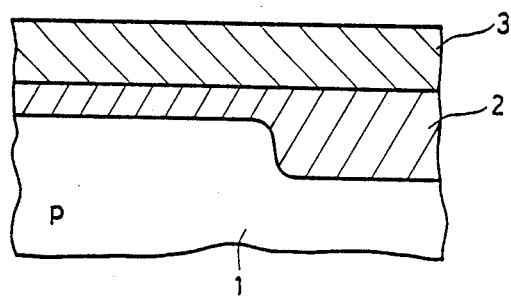
FIGS. 1A to 1E are fragmentary sectional views illustrating the principal steps in a conventional method for forming a silicide electrode in a semiconductor device.
Figure 1B:
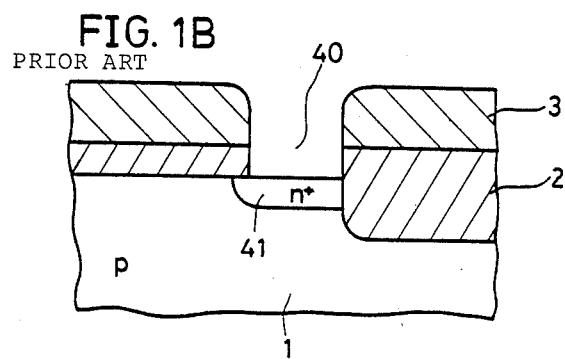
Figure 1C:
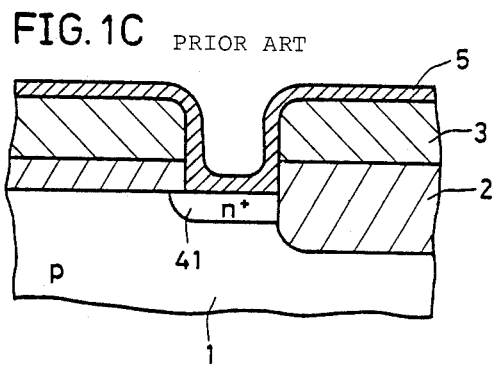
Figure 1D:
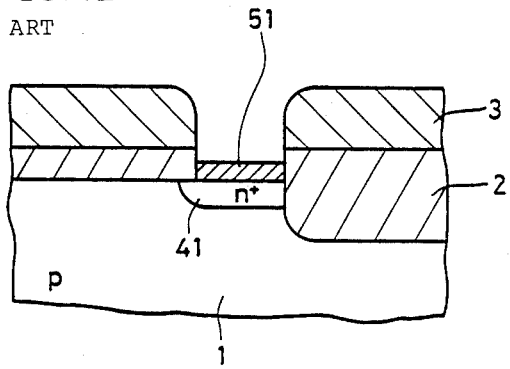
Figure 1E:
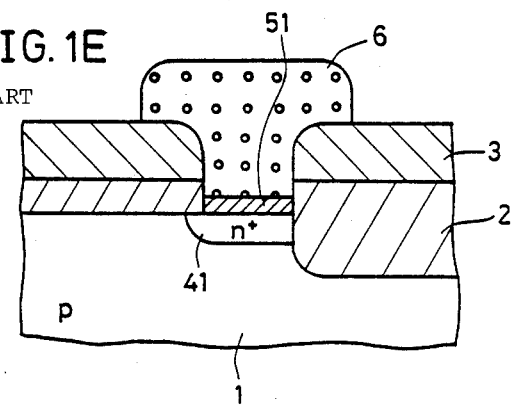
Figure 2:
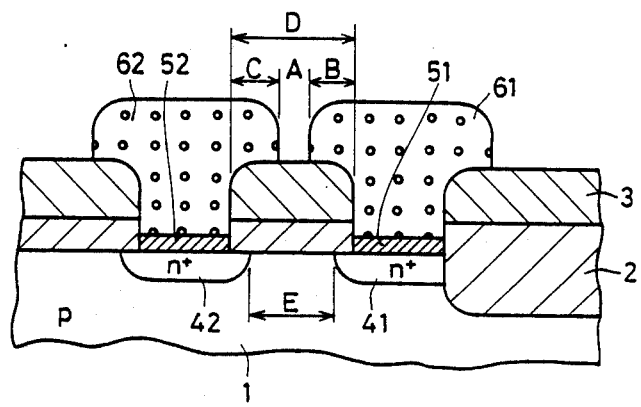
FIG. 2 is a sectional view of an electrode structure formed by the conventional method illustrated by FIGS. 1A to 1E.
Figure 3:
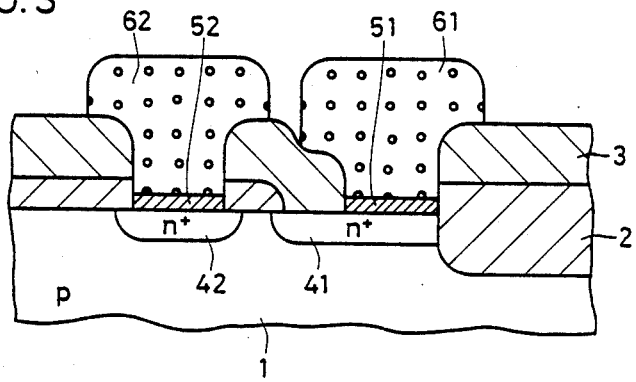
FIG. 3 is a sectional view of another electrode structure formed by another conventional method.
Figure 6:
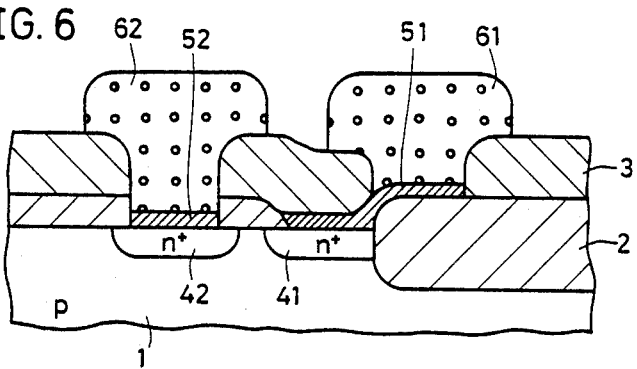
FIG. 6 is a sectional view of an electrode structure in which one of the close electrodes was formed by a method of the present invention.

FIG. 6 is a sectional view of an electrode structure in which one of the close electrodes is formed by a method according to an embodiment of the present invention.

In this figure, a first metal silicide electrode 51 in contact with a first $n^+$-type region 41 is extended onto an oxide layer 2 in accordance with the present invention, so that a first lead wire 61 can be connected with the first electrode 51 at the extended portion. On the other hand, a second silicide electrode 52 is formed by the conventional method to be in contact with a second $n^+$-region 42 and be connected with a second lead wire 62. With the electrode structure of FIG. 6, the $n^+$-type regions 41, 42 can be formed very close to each other without increasing any one of the $n^+$-type regions in area, since the separation between the lead wires 61, 62 can be adjustable independently of the separation between the $n^+$-type regions 41, 42.

Although only the first electrode 51 is formed by a method of the present invention in FIG. 6, it goes without saying that the second electrode 52 may also be formed by the same method according to circumstances.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for forming a metal silicide electrode in contact with a doped region of a silicon substrate through a contact hole which is opened through an insulator film over said substrate, comprising the steps of:

covering said contact hole area and said insulator film with a metal film;

injecting silicon ions into the area of said metal film covering said insulator film portion adjacent said contact hole area;

forming a continuous metal silicide film by annealing only said metal film covering said hole area and said ion-injected metal film area;

removing the remaining non-silicide metal film to leave said metal silicide film as an electrode which extends laterally to cover said hole area and said adjacent portion of said insulator film.

2. A method for forming a metal silicide electrode in contact with a doped region of a silicon substrate through a contact hole which is opened through an insulator film over said substrate, comprising the steps of:

injecting silicon ions into the area of said insulator film adjacent said contact hole area;

covering said contact hole area and said insulator film with a metal film;

forming a continuous metal silicide film by annealing said metal film covering said hole area and said ion-injected area;

removing the remaining non-silicide metal film to leave said metal silicide film as an electrode which extends laterally to cover said hole area and said adjacent area of said insulator film.

* * * * *